United States Patent
Sax

(10) Patent No.: US 7,279,116 B2
(45) Date of Patent: Oct. 9, 2007

(54) METHOD FOR THE WET TREATMENT OF DISK-LIKE OBJECTS

(75) Inventor: Harry Sax, Villach (AT)

(73) Assignee: SEZ AG, Villach (AT)

( * ) Notice: Subject to any disclaimer, the term of this patent is extended or adjusted under 35 U.S.C. 154(b) by 572 days.

(21) Appl. No.: 10/506,473

(22) PCT Filed: Feb. 17, 2003

(86) PCT No.: PCT/EP03/01568

§ 371 (c)(1),
(2), (4) Date: Sep. 3, 2004

(87) PCT Pub. No.: WO03/075324

PCT Pub. Date: Sep. 12, 2003

(65) Prior Publication Data

US 2005/0150867 A1    Jul. 14, 2005

(30) Foreign Application Priority Data

Mar. 6, 2002 (AT) ................. A 348/2002

(51) Int. Cl.
B44C 1/22 (2006.01)
C03C 15/00 (2006.01)
C03C 25/68 (2006.01)
C23F 1/00 (2006.01)

(52) U.S. Cl. ............................. 216/92; 216/88
(58) Field of Classification Search .............. 216/88, 216/92, 41, 45; 156/345.19; 438/748
See application file for complete search history.

(56) References Cited

U.S. PATENT DOCUMENTS 5,896,877 A    4/1999    Willibald

FOREIGN PATENT DOCUMENTS

| EP | 0 316 296 | 5/1989 |
| EP | 1 052 682 | 11/2000 |
| EP | 1 202 326 | 5/2002 |

OTHER PUBLICATIONS

Lysaght PS et al.:, "Clean solutions to the incoming wafer quality impact on lithography process yield limits in a dynamic copper/low-k research and development environment", Proceedings of the SPIE—The International Society for Optical Engineering, vol. 3998, 2000, pp. 284-293, XP008018107 the whole document.

*Primary Examiner*—Parviz Hassanzadeh
*Assistant Examiner*—Roberts Culbert
(74) *Attorney, Agent, or Firm*—Young & Thompson

(57) ABSTRACT

The invention relates to a method for the treatment of disk-like objects with one first liquid and at least one second liquid at least in a defined edge region of a disk-like object.

15 Claims, 2 Drawing Sheets

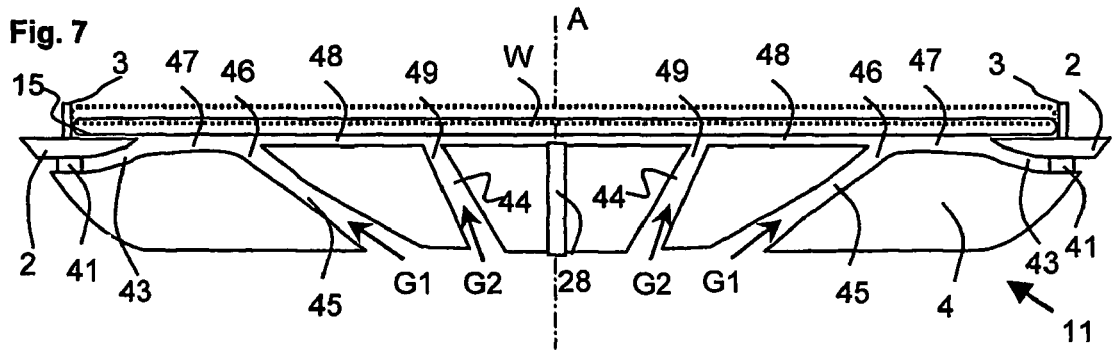
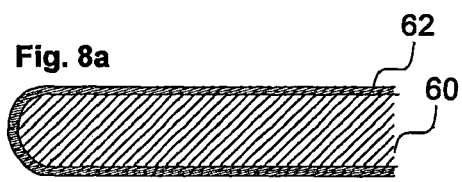
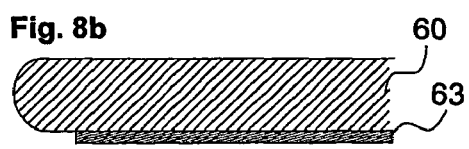
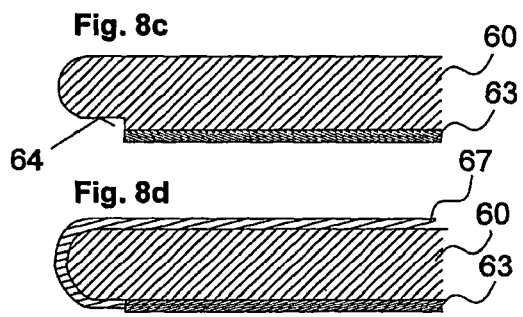
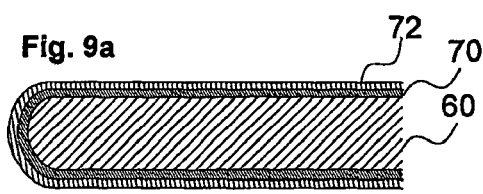
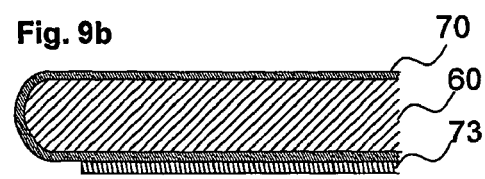
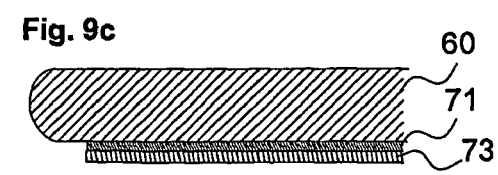
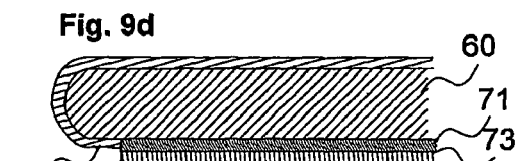
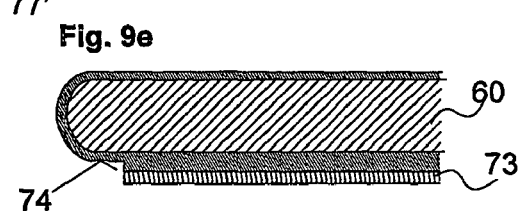

METHOD FOR THE WET TREATMENT OF DISK-LIKE OBJECTS

The invention relates to a method for the wet treatment of a defined region of the main surface of a disk-like object, especially a wafer.

The reason for the treatment of a defined section close to the edge of a disk-like object, and a wafer in particular, will be explained below in closer detail.

A wafer such as a silicon wafer can be provided with a coating of silicon dioxide on all sides for example. For the subsequent processes (e.g. if a gold layer or a layer of polysilicon (polycrystalline silicon) is to be applied) it may be necessary to relieve the wafer from the existing coating at least in the edge region of a main surface and optionally also in the region of its circumferential surface area and/or the second main surface. This occurs by etching methods which can be broken down in particular into dry etching methods and wet etching methods. It may also be desirable to remove a metal applied previously by electroplating (e.g. copper) from certain regions of the main surface of a semi-conductor substrate. In this case this region can either be a ring-like section close to the edge or precisely the region of the main surface on which the structures are situated (device side) or in which no structures are situated, i.e. the chip-free zone.

One reason for removing layers from sections close to the edge can be the following. A large variety of layers are applied in different processes above one another. These layers also cover the edge region of the wafer. During the transport of the wafer the same is touched in a more or less solid fashion in said edge zone. This can lead to the splintering of layers. Particles are thus produced which may contaminate the wafer surfaces.

The invention is aimed at the treatment of disk-like objects with liquids such as the wet etching of layers. The surface section of the wafer to be treated is wetted with the treatment liquid and the layer or impurities to be removed are taken off or a layer is applied in this surface section.

During the treatment with liquid the disk-like object can either be at a standstill or rotate (e.g. about its own axis).

It is therefore the object of the present invention to provide a possibility of treating a defined section on the surface of a disk-like object. It should also be possible, among other things, to treat an edge zone of over 2 mm (as measured from the outer edge of the disk-like object). If in this case a region is limited by a circular line outwardly or inwardly, this is still not necessary. The region to be treated can also be limited by a polygon. When the disk-like object concerns a semi-conductor wafer, said limiting line can correspond to the region of the surface on which the chips are located ("device area"). Accordingly, the outer chip-free region is to be treated.

It is a further object of the invention to treat the defined region successively with two or several mutually different liquids, e.g. in order to remove two or more layers from the disk-like object in the defined edge region. This may be especially problematic in cases where both layers are not attacked by the same etching liquids. The following example is used to explain the problem. Layer A was applied directly onto the bulk silicon of a silicon wafer. Layer B was applied onto layer A. Layer A is made of a silicon dioxide, i.e. one layer which is appreciably attacked by hydrofluoric acid. Layer B is copper, i.e. a layer which is only attacked by strong oxidation agents. On the one hand, strong oxidation agents generally do not attack silicon dioxide. On the other hand, copper is hardly attacked by hydrofluoric acid.

In its most general embodiment, the invention proposes a method for treating disk-like objects with a first liquid and at least one second liquid at least in a defined edge region of a disk-like object, with the first liquid differing from the second liquid.

The difference between the two liquids can be given by the choice of the components or their concentration.

Treatment shall be understood herein as wet etching, wet cleaning or also an electrochemical treatment (galvanic etching, galvanic coating (electroplating)) for example. The surface can also be treated in a wet chemical fashion by superficial transformation (oxidation).

The method comprises the following successive steps:

The disk-like object is brought close to a mask, with the distance $a1$ to the mask being equal to or larger than 0 mm and the mask overlapping with the disk-like object in the region in which the disk-like object is to be treated;

Application of the first liquid, so that the same is held in the region between the mask and the disk-like object;

Increasing the distance between the mask and the disk-like object to a distance $a2$;

Removal of the residues of the first liquid remaining on the disk-like object;

Reduction of the distance between the mask and the disk-like object to a distance $b1$;

Application of the second liquid, so that the same is held in the region between the mask and the disk-like object;

Increasing the distance between the mask and the disk-like object to a distance $b2$;

Removal of the residues of the second liquid remaining on the disk-like object.

Whereas previously defined edge regions with masks could only be treated with a single liquid, the method now offers the possibility of treating a defined edge region successively even with several different liquids. This method offers the additional advantage that said different liquids are not mixed with each other.

In an embodiment of the method, the first liquid removes a first layer from the disk-like object and the second liquid treats the uncovered surface. The second liquid can etch the uncovered surface. When the uncovered surface is the surface of a further second layer, the second liquid can etch the uncovered surface so that said second layer is only thinned out or also removed.

Both the first layer as well as the second layer can consist of one or several partial layers of different materials, with the common aspect of the partial layers being that they can be etched or removed by the same liquids (etching solution). Whereas previously it was only possible to etch combinations of layers which could be removed with one etching reagent, this method now offers the possibility to also remove combinations of layers from a defined edge region which require different etching reagents.

According to an advantageous embodiment of the method, the distance $a2$ or $b2$ is to be at least one and a half times as large as the distance $a1$ or $b1$. The probability is thus substantially increased in this manner that a liquid film is destroyed which is held by capillary forces between the disk-like object and the mask.

In a further embodiment of the method at least one of the at least two etching liquids is applied to the side averted from the mask, flows about the edge on the circumferential side of the disk-like object and then penetrates the region between the mask and the disk-like object. In this way the etching liquid can be distributed evenly on the entire edge of the disk-like object.

It is thus also simultaneously possible to at least partly remove at least one layer on the side of the disk-like object which is averted from the mask.

At least one of the materials of the layer to be removed can consist of the following group: Silicon dioxide (thermal oxide, TEOS (tetraethoxysilane)), silicon nitride, titanium, titanium nitride, tantalum, tantalum nitride, cobalt, gold, silver, platinum, tungsten, tungsten silicide, polysilicon, copper, aluminum, silicate glass (fluorinated silicate glass, boron silicate glass (BSG), phosphorus boron silicate glass (PBSG), phosphorus silicate glass (PSG), undoped silicate glass (USG)), boron strontium titanate (BST), lead zirconium titanate (PZT).

At least one of the materials can be chosen from the group consisting of titanium, titanium nitride, tantalum, tantalum nitride, cobalt, gold, silver, platinum, tungsten, tungsten silicide, polysilicon, copper, aluminum and another material from the group of silicon nitride, silicon dioxide, silicate glass. The one group contains materials which can preferably be removed with oxidizing etching reagents. The other group contains materials which are removed with etching reagents containing hydrofluoric acid.

In an advantageous method the removal of the residues of the first etching solution remaining on the disk-like object occurs in such a way that the remaining residues of the first etching solution are thrown off. In other embodiment the removal of the residues of the first etching solution remaining on the disk-like object occurs by rinsing with a liquid. Both embodiments prevent that corrosion occurs by remaining residues of etching reagents on the surface of the disk-like object. Furthermore, the carrier and, in combination with the same, the wafer can also rotate during the entire treatment.

The increase and decrease of the distance between the mask and the disk-like object can occur by lifting or lowering the disk-like object. As a result, the mask can be joined in a fixed fashion to the carrier.

In an advantageous method the lifting or lowering of the disk-like object occurs in such a way that the surface of the disk-like object facing the mask is blown against via gas nozzles, namely by providing a respective change of the speed component of the gas stream which acts normally on the surface of the disk-like object. This leads to the advantage that the surface of the disk-like object which faces the carrier does not have to be touched. Instead, it is brought into a suspended state further away from the mask. The increase of the speed component of the gas stream acting normally on the surface of the disk-like object can occur in different ways. The gas stream of a plurality of gas nozzles directed in an inclined or normal manner to the surface of the disk-like object is increased or even only activated or the position of a plurality of gas nozzles directed in an inclined fashion to the surface of the disk-like object is changed in such a way that the gas nozzles are directed in a steeper way towards the surface of the disk-like object.

In an embodiment of the method, the disk-like object is held by grasping elements on the circumferential side during the etching treatment. The lifting and lowering of the disk-like object can be facilitated here in such a way that during the lifting and lowering of the disk-like object the grasping elements are not in contact with the object. For this purpose the grasping elements (e.g. holding pins) can be briefly opened.

BRIEF DESCRIPTION OF THE DRAWINGS

FIG. 7 shows an apparatus that might be operated to perform an embodiment of the invention;

FIGS. 8a-8d show possible treatment stages of a wafer according to another embodiment of the invention and;

FIGS. 9a-9e show possible treatment stages of a wafer according to yet another embodiment of the claimed invention.

Figure 1:
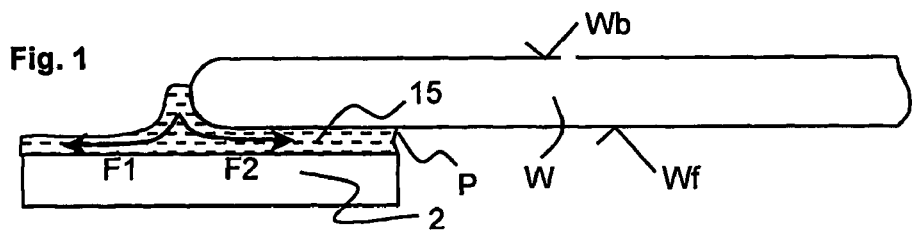
FIGS. 1-6 how a sequence of process steps according to an embodiment of the invention.

An apparatus is described below by reference to FIG. 7 with which the claimed method can be performed. The apparatus consists of a carrier 11 (chuck) which consists of a basic body 4 and a ring 2. The ring is fastened to the basic body at a distance from the same by means of a spacer body 41. The surface of the ring facing the wafer is a plane, namely parallel to the main surface of the wafer. Pins 3 (holding pins) are fastened to the ring 2 which can be moved radially outwardly relative to the rotational axis A of the carrier 11 and can enclose the wafer W on the circumferential side. The pins 3 are provided with the shape of small cylinders with their axes being perpendicular to the surface of the wafer. Gas conduits 44 and 45 are incorporated in the basic body 4 which open into gas nozzles 46 and 49 and face towards the surface of the wafer facing the carrier 11. The nozzles 46 and 49 are placed in an outwardly oblique fashion. The nozzles 49 which are situated further inside are positioned in a less oblique manner than the nozzles 46 situated further on the outside, meaning that the emerging gas stream G1 of the nozzles 46 situated further on the outside impinges at a flatter angle on the wafer surface than the emerging gas stream G2 of the nozzles situated further on the inside. Both the nozzles 49 situated on the inside as well as the nozzles 46 situated on the outside can optionally either be a plurality of circularly arranged nozzles or can be in the shape of annular nozzles.

The contour of the ring (mask) on the inside is usually a circle. Said circle comprises a radius which is smaller to such an extent as the radius of the wafer is to be wide with respect to the edge region of the wafer to be etched. When the edge of the wafer which comprises a so-called flat is to be etched and the edge region in the zone of the flat is to be treated, then the contour of the mask must be chosen accordingly. When the method is performed notice must be taken that the wafer is placed on the chuck in such a way that the flat of the wafer comes to lie in the zone of the flat of the inside contour of the ring. In order to prevent that the wafer twists relative to the ring during the treatment, grasping means (holding pins) are proposed which touch the wafer in the region of the flat. Said grasping means can be provided with a mobile or rigid arrangement.

The apparatus as described in FIG. 7 can be operated in two substantially different ways. In the first operating mode the outer gas stream G1 and the inner gas stream G2 can be activated and deactivated separately from each other. If only the first gas stream G1 is activated, the gas only flows over the region 47. The wafer W is lifted only slightly, thus producing a small capillary-like gap 15 between mask 2 and wafer W. It is also possible that no gas stream is activated for example, as a result of which the wafer rests on the mask (ring). If in this first operating state liquid is now applied onto the upper side of the wafer, it is pulled into the gap 15. If gas stream G2 is activated in addition to or instead of gas stream G1, gas not only flows over the region 47 outside of the outer nozzles 46 but also over the region 48 between the outer and inner nozzles. As a result of said second operating state, the wafer W is slightly lifted, as is represented by the dotted line. The wafer edge slides along the cylinder surface of the pins 3, for which purpose it may be necessary to temporarily slightly open the pins. Said slight lifting of the wafer is sufficient to ensure that the liquid in the gap 15 between mask and wafer is no longer held by capillary forces. The liquid can be removed from this region which occurs by the gas stream, i.e. the drops are blow away in a radially outward fashion. The removal of the liquid can be supported in such a way that the entire carrier 11 rotates, and with it the wafer. In addition, a scouring liquid which is supplied through the liquid line 28 can be guided through the basic body 4 onto the wafer surface facing the carrier, as a result of which the liquid situated in gap 15 is additionally pushed away. Said scouring liquid naturally needs to be removed as well, which is performed by throwing it off.

In the second operating mode both gas streams G1 and G2 are switched jointly. In a first operating state less gas flows than in a second operating state; as a result of which the wafer assumes a position in the second operating state in which its distance to mask 2 is larger than in the first operating state. The distance of the wafer W to the mask 2 in the first operating state is 0.3 mm and 0.8 mm in the second for example.

Different possible embodiments of the method are described in FIGS. 8 and 9.

FIGS. 8a to 8d show possible treatment stages of a wafer (in the cross section) which originally was applied with a layer 62 on its core 60 (bulk silicon) (FIG. 8a). Thereafter, said layer 62 is removed on the upper side, in the edge region and In the defined region of the lower side of the wafer close to the edge. A layer 63 (FIG. 8b) remains. The uncovered surface is now treated with a second liquid. It is either cleaned or etched for example (etched region 64 in FIG. 8c) or a new layer 67 is applied (FIG. 8d).

FIGS. 9a to 9e show possible treatment stages of a wafer (in the cross section) where two layers (70, 72) were originally applied on its core 60 (FIG. 9a). Thereafter the first layer 72 is removed on the upper side, in the edge region and in the defined region of the bottom side close to the edge. The layer 73 (FIG. 9b) remains and the layer 70 is uncovered accordingly. Now the uncovered surface of layer 70 is treated. It is cleaned, etched or a new layer is applied (not shown) for example. When the uncovered surface of the layer 70 is etched, it can merely be thinned out (thinned region 74, FIG. 9e) or completely removed in the treated region, with the layer 71 remaining (FIG. 9c). After the removal of the two layers 70 and 72 in the treated region it is now possible to apply a layer 77 on the uncovered surface (FIG. 9d).

Figure 2:
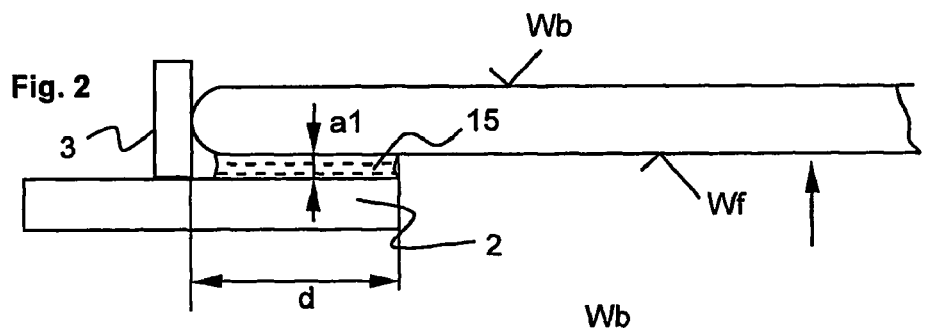
Figure 3:
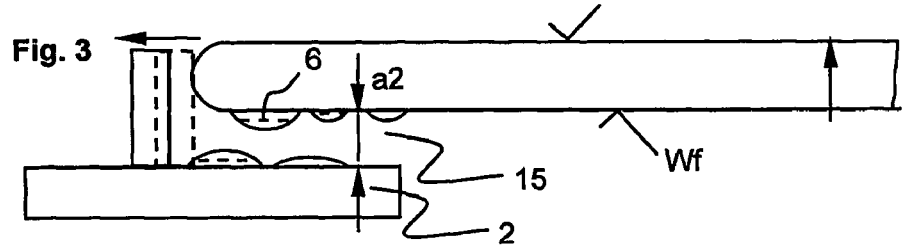
Figure 4:
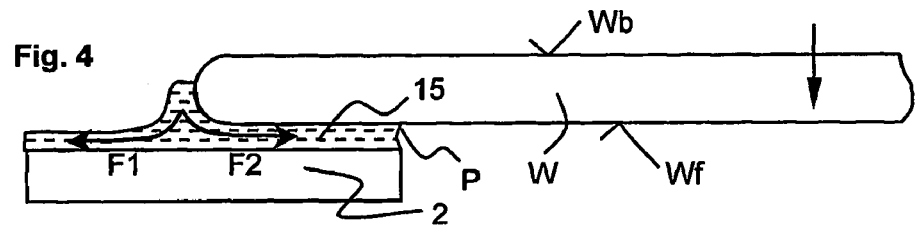
Figure 5:
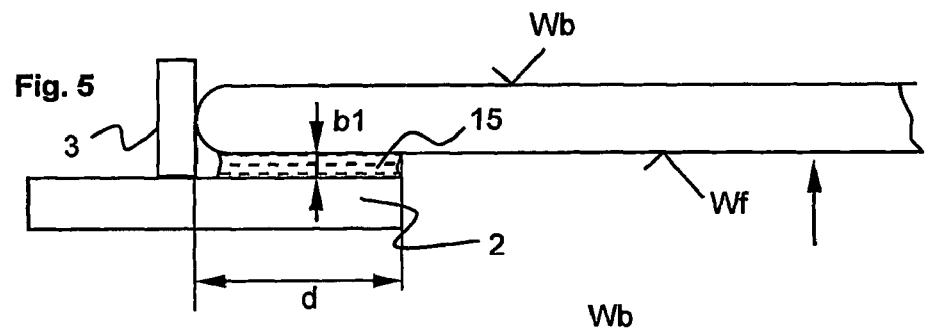
Figure 6:
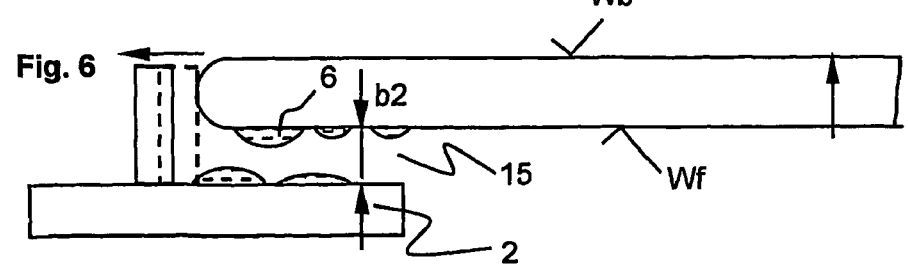

An example for a possible sequence of the process steps is described below by reference to FIGS. 1 to 6:

a) The wafer W is placed on the chuck with a gas volume flow rate (G1+G2) of 0-40 l/min, thus producing a distance a1 of 0-0.3 mm of the wafer to the mask: The wafer now rests on the mask and floats on a gas cushion. Holding pins 3 are closed. The front side of the wafer (Wf, "device side") faces the chuck or the ring 2. The distance is chosen in such a way that etching liquid which penetrates between the wafer and the mask does not penetrate any further than the mutual overlap of wafer and mask. Even when the distance is 0 mm the etching liquid penetrates the region between wafer and mask, which is produced by the surface roughness of the mask and/or the wafer.

b) The chuck with the wafer is rotated with a speed of 300 min$^{-1}$. Application of a first etching reagent on the rear side Wb of the wafer. The etching reagent flows by centrifugal force to the edge of the wafer about its edge and partly F2 onto the front side Wf of the wafer (FIG. 1). The majority F1 of the etching medium is thrown off. All layers which can be removed by the first etching reagent on the rear side, the wafer edge and the front side insofar as the wafer and mask overlap each other are removed, i.e. up to point P (region d). A part of the etching liquid remains in the capillary-like region 15 between the front side of the wafer and the mask (FIG. 2).

c) The application of liquid is stopped.

d) The gas volume flow rate is increased to 100-300 l/min, thus producing a distance a2 of 0.7-1.4 mm of the wafer to the mask. It may be necessary to briefly open the holding pins (FIG. 3). The liquid film between mask 2 and the front side of the wafer is destroyed, as is illustrated by drops 6.

e) The first etching liquid is thrown off with 3000 min$^{-1}$. The portion of the etching liquid which remains in the capillary between the front side of the wafer and the mask is thus removed from this region.

f) Optionally, a scouring liquid (e.g. de-ionized water) can be applied on the front and/or rear side for improving the removal of the residues of the etching liquid. Since the distance between the wafer and the mask is too large, it is not held in between by capillary forces and can therefore be thrown off easily. The distance necessary for this purpose or the respective gas volume flow rate can be determined empirically.

g) The gas volume flow is reduced to 0-40 l/min, thus producing a distance b1 of 0-0.3 mm of the wafer relative to the mask. It may be necessary to briefly open the holding pins so that the wafer will lower (FIGS. 4 and 5).

h) Repetition of the steps b)-f) (FIGS. 4-6). Instead of the first etching liquid a second etching liquid is used which is different from the first one.

i) Optionally, repetition of step g) and subsequent repetition of steps b)-f). Instead of the second etching liquid a third etching liquid is used which is different from the second etching liquid. A third etching liquid can be similar to the first etching liquid.

j) Drying of the wafer.

k) Opening of the holding pin 3 and removal of the wafer from the chuck.

The following two examples show possible layer structures (stack) and the respective etching reagents with which the layers can be removed. The sequence of the layers is chosen here according to the sequence with which the layers are removed.

Example 1

| | Material of layer to be removed | Layer thickness | Etching reagent |
|---|---|---|---|
| 1 | Silicon dioxide, applied by P-TEOS (plasma-supported chemical vapor deposition (plasma CVD) of tetraethoxysilane) | 600 nm | Hydrous solution of 34% hydrofluoric acid |
| 2 | Plasma-supported applied silicon nitrides (PE-SiN) | 250 nm | |

-continued

| Material of layer to be removed | Layer thickness | Etching reagent |
|---|---|---|
| 3 Barrier layer (titanium nitride) | 3–5 nm | Hydrous solution of 2% hydrofluoric acid and 66% nitric acid |
| 4 Thermal silicon dioxide | 100 nm | Hydrous solution of 10% hydrofluoric acid |

Example 2

| Material of layer to be removed | Layer thickness | Etching reagent |
|---|---|---|
| 1 Copper (PVD layer, galvanic layer) | 600 nm | 69% nitric acid |
| 2 Barrier layer (titanium nitride) | 3–5 nm | Hydrous solution of 2% hydrofluoric acid and 66% nitric acid |
| 3 Thermal silicon dioxide | 100 nm | Hydrous solution of 10% hydrofluoric acid |

The invention claimed is:

1. A method for treating disk-like objects with a first liquid and at least one second liquid at least in a defined edge region of a disk-like object, with the first liquid differing from the second liquid, characterized by the following successive steps:
   1.1 the disk-like object is brought close to a mask, with the distance a1 to the mask being equal to or larger than 0 mm and the mask overlapping with the disk-like object in the region in which the disk-like object is to be treated;
   1.2 application of the first liquid, so that the same is held in the region between the mask and the disk-like object;
   1.3 increasing the distance between the mask and the disk-like object to a distance a2;
   1.4 removal of the residues of the first liquid remaining on the disk-like object;
   1.5 reduction of the distance between the mask and the disk-like object to a distance b1;
   1.6 application of the second liquid, so that the same is held in the region between the mask and the disk-like object;
   1.7 increasing the distance between the mask and the disk-like object to a distance b2;
   1.8 removal of the residues of the second liquid remaining on the disk-like object.

2. A method as claimed in claim 1, wherein the first liquid removes a first layer from the disk-like object and the second liquid treats the uncovered surface.

3. A method as claimed in claim 2, wherein the second liquid etches the uncovered surface.

4. A method as claimed in claim 3, wherein the second liquid etches the uncovered surface in such a way that the second layer situated underneath is removed.

5. A method as claimed in claim 1, wherein the distance a2 or b2 is at least one and a half times as large as the distance a1 or b1.

6. A method as claimed in claim 1, wherein at least one of the at least two liquids is applied to the side averted from the mask, flows around the circumferential edge of the disk-like object and then penetrates the region between the mask and the disk-like object.

7. A method as claimed in claim 2, wherein at least one layer is removed at least partly on the side averted from the mask.

8. A method as claimed in claim 2, wherein at least one of the materials of a layer consists of the group comprising silicon dioxide (thermal oxide, TEOS (tetraethoxysilane)), silicon nitride, titanium, titanium nitride, tantalum, tantalum nitride, cobalt, gold, silver, platinum, tungsten, tungsten silicide, polysilicon, copper, aluminum, silicate glass (fluorinated silicate glass, boron silicate glass (BSG), phosphorus boron silicate glass (PBSG), phosphorus silicate glass (PSG), undoped silicate glass (USG)), boron strontium titanate (BST), lead zirconium titanate (PZT).

9. A method as claimed in claim 8, wherein at least one of the materials of a layer is of the group consisting of titanium, titanium nitride, tantalum, tantalum nitride, cobalt, gold, silver, platinum, tungsten, tungsten silicide, polysilicon (polycrystalline silicon), copper, aluminum and another material from the group of silicon nitride, silicon dioxide, silicate glass.

10. A method as claimed in claim 1, wherein the removal of the residues of the first etching solution remaining on the disk-like object occurs in such a way that the remaining residues of the first etching solution are ejected off.

11. A method as claimed in claim 1, wherein the removal of the residues of the first etching solution remaining on the disk-like object occurs by scouring with a liquid.

12. A method as claimed in claim 1, wherein the increase or decrease of the distance between the mask and the disk-like object occurs by lifting or lowering the disk-like object.

13. A method as claimed in claim 1, wherein the lifting or the lowering of the disk-like object occurs in such a way that the surface of the disk-like object facing the mask is flowed against via gas nozzles, namely by a respective change made to the speed component of the gas stream which acts normally on the surface of the disk-like object.

14. A method as claimed in claim 1, wherein the disk-like object is held on the circumferential side by grasping elements during etching treatment.

15. A method as claimed in claim 14, wherein the grasping elements are not in contact during the lifting and lowering of the disk-like object.

* * * * *